United States Patent [19]
Takebuchi

[11] Patent Number: 5,553,016
[45] Date of Patent: Sep. 3, 1996

[54] SEMICONDUCTOR MEMORY DEVICE

[75] Inventor: Masataka Takebuchi, Yokohama, Japan

[73] Assignee: Kabushiki Kaisha Toshiba, Kawasaki, Japan

[21] Appl. No.: 36,692

[22] Filed: Mar. 25, 1993

[30]       Foreign Application Priority Data

Mar. 26, 1992   [JP]   Japan ..................... 4-068272

[51]  Int. Cl.$^6$ ................................. G11C 17/00
[52]  U.S. Cl. .................. 365/51; 365/63; 365/185.17
[58]  Field of Search ................. 365/51, 63, 185, 365/218, 900, 185.17

[56]          References Cited
         U.S. PATENT DOCUMENTS 4,811,303   3/1989   Hirai ..................... 365/185 X
4,964,078  10/1990   Jandu et al. ............... 365/51

*Primary Examiner*—Joseph A. Popek
*Attorney, Agent, or Firm*—Banner & Allegretti, Ltd.

[57]             ABSTRACT

A semiconductor memory device includes different types of memory matrices adjacently arranged such that bit lines are aligned in the same cell matrix region, a column decoder for selecting the bit lines of the memory matrix, and a row decoder for selecting the row lines of the memory matrix. Therefore, a semiconductor memory device having many types of memory matrices can be highly integrated in the same cell matrix region in the same layout.

10 Claims, 7 Drawing Sheets

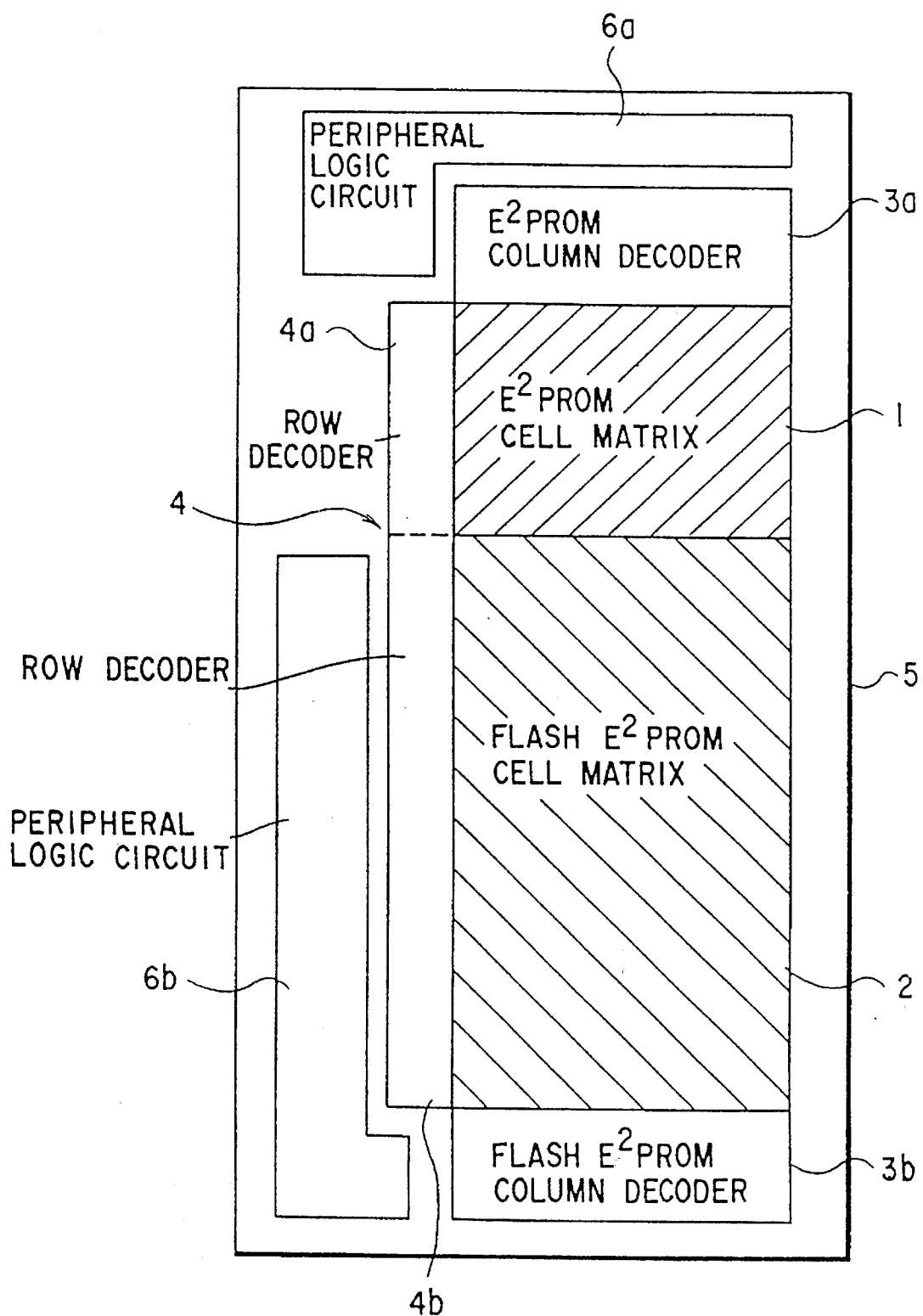
F I G. 1

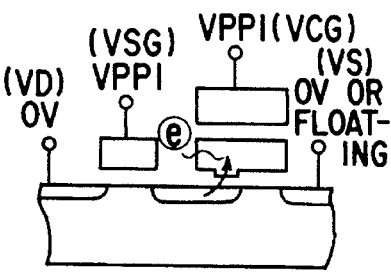
F I G. 4

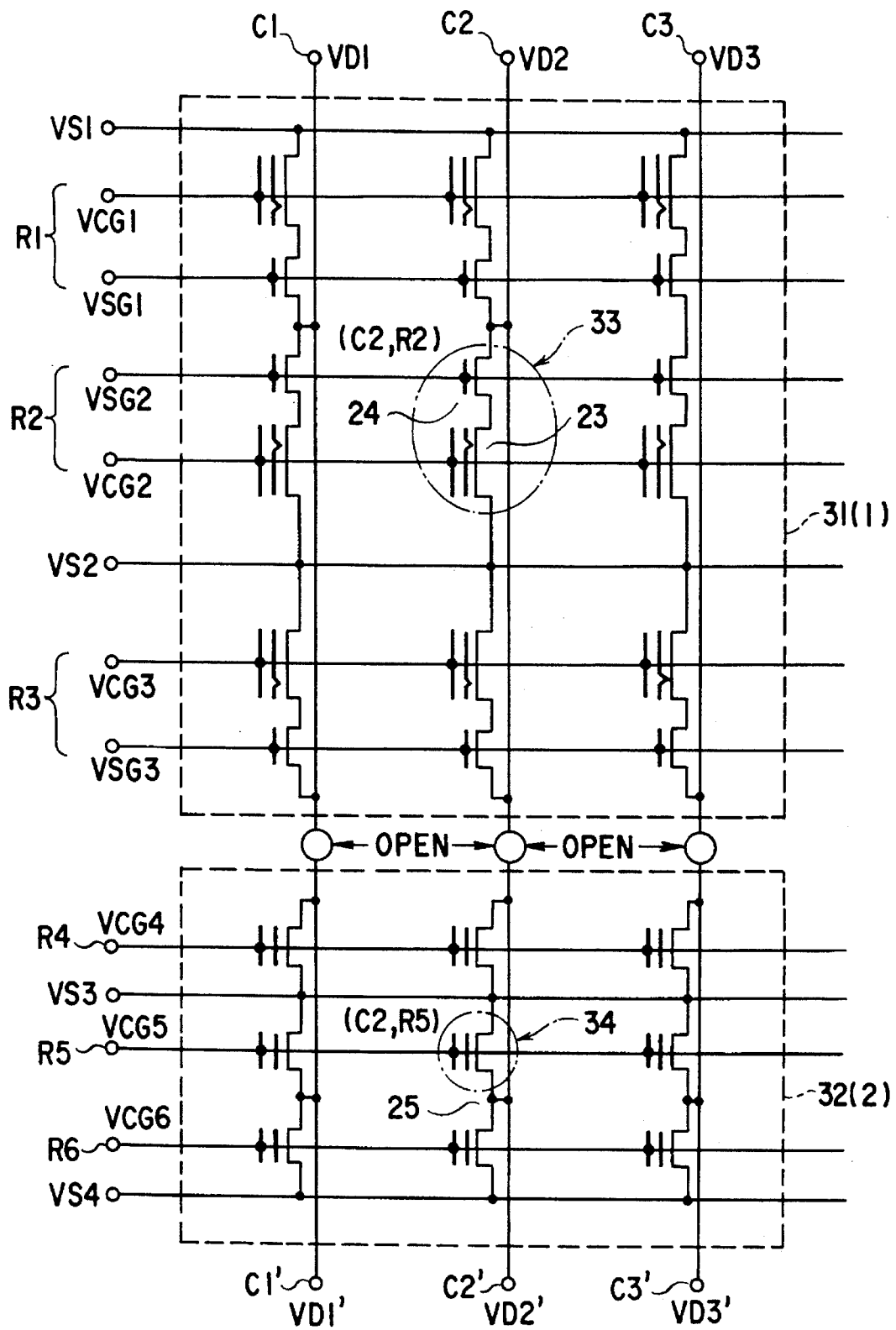
F I G. 5

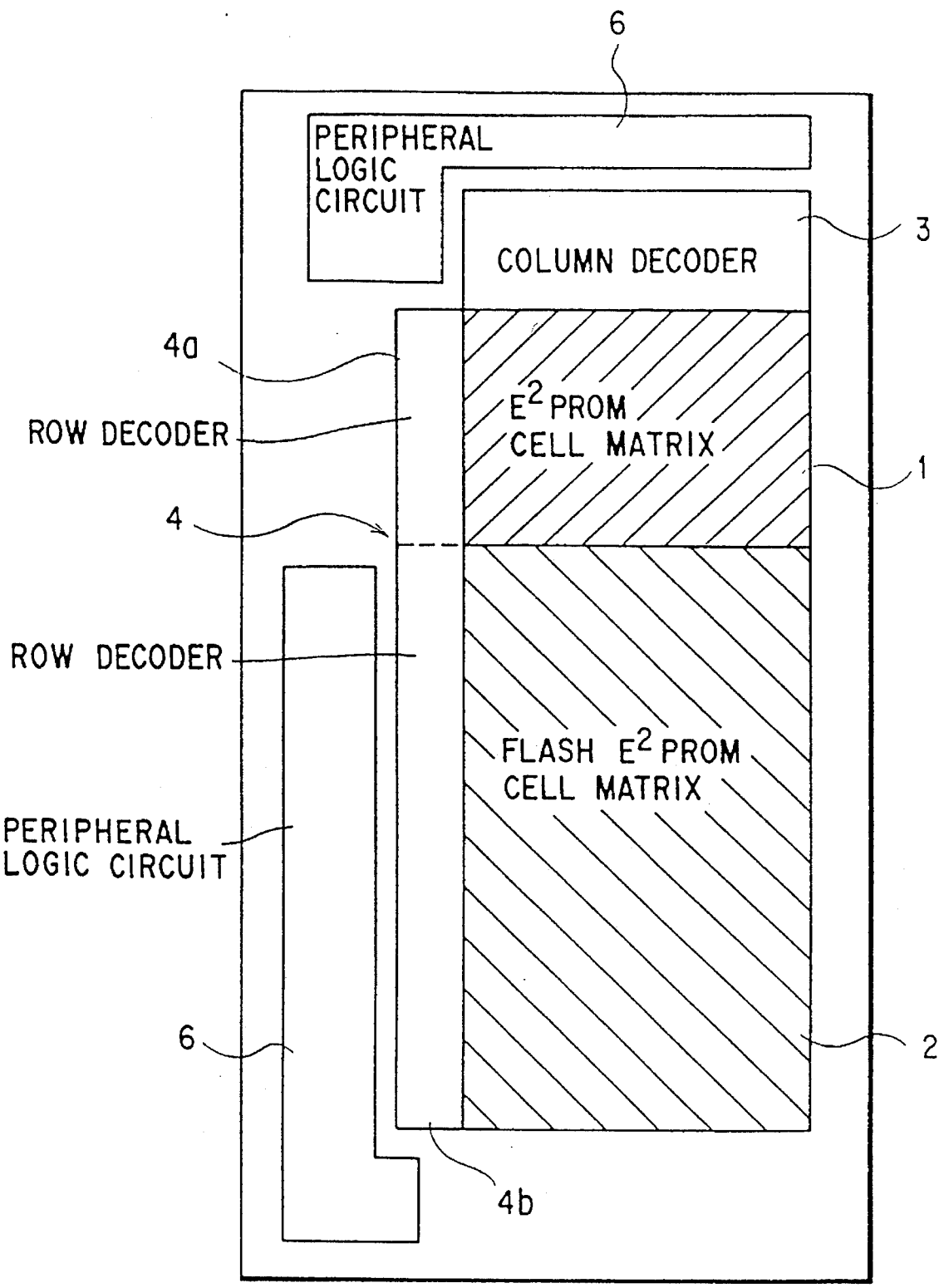
F I G. 6

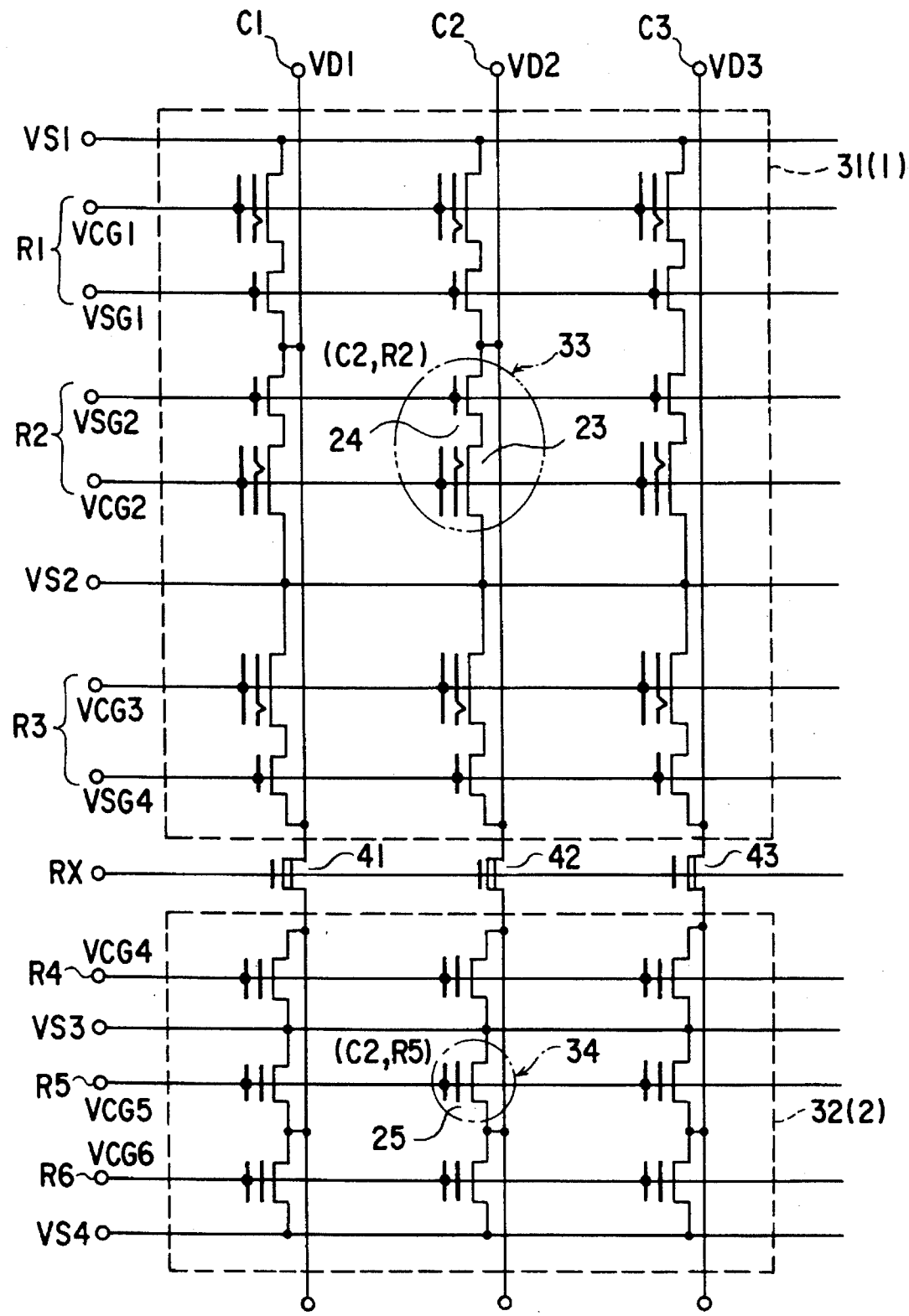
F I G. 7

५,५५३,०१६

SEMICONDUCTOR MEMORY DEVICE

BACKGROUND OF THE INVENTION

1. Field of the Invention

The present invention relates to a semiconductor memory device in which different types of memory matrices are formed in the same cell matrix region.

2. Description of the Related Art

In recent years, various semiconductor memory devices have been developed and the number of the types of semiconductor memory devices has been increased. As various and advanced techniques have been developed, it has been frequently required that different types of semiconductor memories are mounted on the same semiconductor substrate. Conventionally, when at least two types of memory matrices which have different structures or different operations are to be formed on the same semiconductor substrate, the memory matrices are respectively formed at independent positions on the semiconductor substrate. Each of the memory matrices is a memory circuit constituted such that memory cells are aligned to have a certain regularity in X and Y directions and the memory cells are connected to row and column lines. Each of the memory cells is a memory unit constituted by at least source/drain diffusion layers formed on the semiconductor substrate surface to have a predetermined interval, and a conductive electrode serving as a gate electrode formed on the semiconductor substrate surface between the diffusion layers through a gate insulating film. As described above, even when the conventional different types of memory matrices are formed on the same chip, the memory matrices are formed as independent memory circuits in different layouts. Therefore, in the conventional technique, although it is considered that the independent circuits are mounted at the positions for arranging the memory matrices, the independent circuits are not considered as an integrated circuit. For this reason, there are waste spaces between the memory matrices and there is an overlapped and redundant circuit, thereby preventing the memory matrices from being highly integrated.

SUMMARY OF THE INVENTION

The present invention has been made in consideration of the above circumstances, and has as its object to provide a semiconductor memory device in which different types of memory matrices can be integrated at a high integration density on the same semiconductor substrate as the cell matrices having the same layout.

According to an aspect of the present invention, there is provided a semiconductor memory device comprising: different types of memory matrices adjacently arranged in the same layout such that column lines are opposite to each other in the same cell matrix region on the same semiconductor substrate; a column decoder for alternatively selecting column lines of each of the different types of memory matrices; and a row decoder for alternatively selecting row lines of each of the different types of memory matrices.

According to another aspect of the present invention, there is provided a semiconductor memory device comprising: different types of first and second memory matrices adjacently arranged in the same layout in the same cell matrix region on the same semiconductor substrate such that column lines are opposite to each other; a first column decoder for alternatively selecting column lines of the first memory matrix and a first row decoder for alternatively selecting row lines of the first memory matrix; and a second column decoder for alternatively selecting column lines of the second memory matrix and a second row decoder for alternatively selecting row lines of the second memory matrix.

According to still another aspect of the present invention, there is provided a semiconductor memory device comprising: different types of memory matrices which have common column lines extending between the different types of memory matrices in the same cell matrix region on the same semiconductor substrate and are adjacently arranged in the same layout; a common column decoder for alternatively selecting the common column lines of the different types of memory matrices; and a plurality of row decoders, respectively arranged to the different types of memory matrices, each for alternatively selecting row lines of a corresponding one of the different types of memory matrices.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plan view showing the schematic pattern layout of a semiconductor memory device according to the first embodiment of the present invention;

FIG. 4 is a table showing the biasing operations of the EEPROM and flash EEPROM in FIG. 1;

FIG. 5 is a circuit diagram showing a main part of the semiconductor memory device of the first embodiment in FIG. 1;

FIG. 6 is a plan view showing the schematic pattern layout of a semiconductor memory device according to the second embodiment of the present invention;

FIG. 7 is a circuit diagram showing a main part of the semiconductor memory device of the second embodiment in FIG. 6.

DETAILED DESCRIPTION OF THE PREFERRED EMBODIMENTS

Figure 2A:
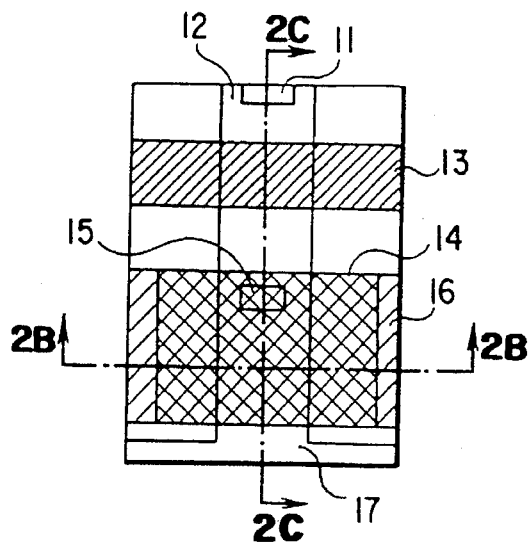
FIGS. 2A to 2C are plan and sectional views showing the arrangement of an EEPROM cell in FIG. 1.

Semiconductor memory devices according to the embodiments of the present invention will be described below with reference to the accompanying drawings.

FIG. 1 is a view showing the schematic pattern layout of a semiconductor memory device according to the first embodiment of the present invention. In the first embodiment in FIG. 1, different types of memory matrices are formed as an integrated memory matrix in the same cell matrix region of the same memory region on a semiconductor substrate 5. The different types of memory matrices are illustrated in FIG. 1 as an EEPROM (abbreviated to $E^2$PROM: Electrically Erasable Programmable ROM) cell matrix 1 and a flash EEPROM (Flash $E^2$PROM: Flash Electrically Erasable Programmable ROM) cell matrix 2. The memory cell matrices 1 and 2 are integrated with each other in the same memory cell matrix region such that the bit lines of the matrices 1 and 2 are continuously and commonly connected. An EEPROM column decoder 3a selects a drain (bit) line of the EEPROM cell matrix 1. A row decoder 4a selects a row line of the cell matrix 1. A flash EEPROM column decoder 3b selects a drain (bit) line of the flash EEPROM cell matrix 2. A row decoder 4b selects a row line of the cell matrix 2. Peripheral logic circuits 6a and 6b and the like are arranged on the semiconductor chip 5. As a matter of course, a row decoder 4 may be formed by integrating the column and row decoders 4a and 4b. The row decoder 4 may select a row line of the cell matrix 1 or 2. In the first embodiment, a case wherein the EEPROM and flash EEPROM are integrally arranged will be described below. However, by using the technical concept according to the present invention, each of all pairs of adjacent memories such as a pair of a mask ROM and an EEPROM and a pair of a RAM and an EEPROM can be formed in the same matrix formation.

Figure 2B:
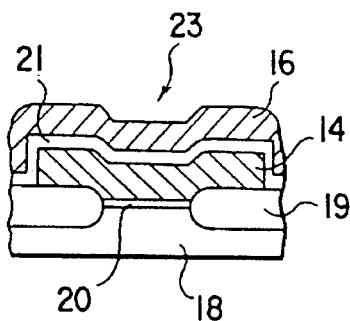
Figure 2C:
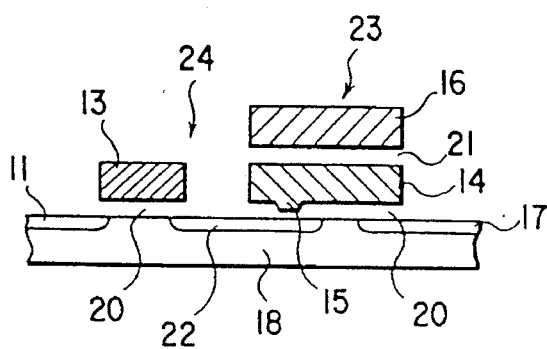

FIGS. 2A to 2C are plan and sectional views showing the arrangement of one memory cell in the EEPROM cell matrix 1 in FIG. 1. FIG. 2A is a plan view showing the pattern of the memory cell, FIG. 2B is a sectional view showing the memory cell along a line 2B—2B in FIG. 2A, and FIG. 2C is a sectional view showing the memory cell along a line 2C—2C in FIG. 2A. In FIGS. 2A to 2C, reference numeral 11 denotes a drain region; 12, an active element region; 13, a selection gate electrode; 14, a floating gate electrode; 15, a tunnel oxide film; 16, a control gate electrode; 17, a source region; 18, a P-type substrate; 19, a field oxide film; 20, a gate oxide film; 21, an insulating film between the floating gate 14 and the control gate 16; and 22, an N-type diffusion layer. Reference numeral 23 denotes a transistor of a data holding unit, and reference numeral 24 denotes a transistor, i.e., a selection transistor, of a transfer gate unit for outputting data to a bit line. That is, this EEPROM cell is constituted by the two transistors/cell.

Figure 3A:
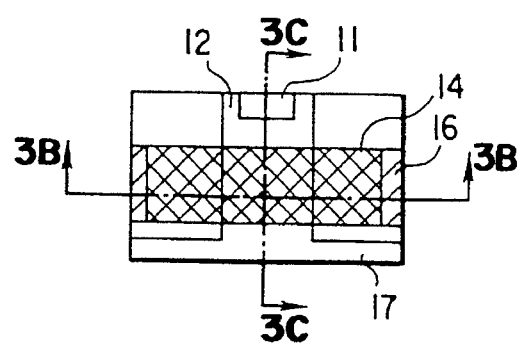
FIGS. 3A to 3C are plan and sectional views showing the arrangement of a flash EEPROM cell in FIG. 1.
Figure 3B:
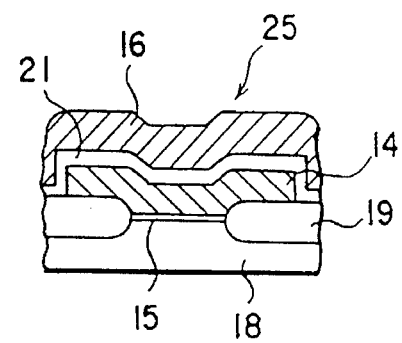
Figure 3C:
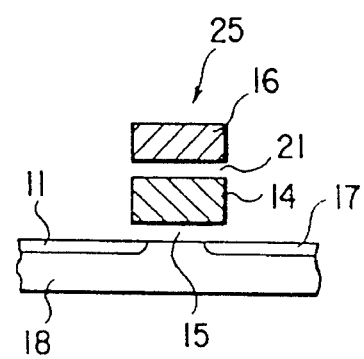

FIGS. 3A to 3C are plan and sectional views showing the arrangement of one memory cell in the cell matrix of the flash EEPROM cell matrix 2 in FIG. 1. FIG. 3A is a plan view showing the pattern of the memory cell, FIG. 3B is a sectional view showing the memory cell along a line 3B—3B in FIG. 3A, and FIG. 3C is a sectional view showing the memory cell along a line 3C—3C in FIG. 3A. The same reference numerals as in FIG. 2A to 2C denote the same parts in FIGS. 3A to 3C. Reference numeral 25 denotes a cell transistor. A flash EEPROM cell shown in FIGS. 3A to 3C is constituted by one transistor/cell.

FIG. 4 is a table showing biasing operations of the EEPROM and flash EEPROM in FIG. 1. FIG. 4 shows potentials applied to the electrodes of the EEPROM and flash EEPROM in the erase, write, and read operations. In the EEPROM, charges are transferred by using electron injection (ERASE), electron extraction (WRITE), and a Fowler-Nordheim tunnel (abbreviated as an FN tunnel) operation. On the other hand, in the flash EEPROM, a channel hot electron effect is used during the electron injection (WRITE), and an FN tunnel operation is used during the electron extraction (ERASE). In FIG. 4, reference symbol VD denotes a drain voltage; VSG, a selection gate voltage; VCG, a control gate voltage; and VS, a source voltage. In the present invention, voltage values are set as follows: VPP1=18 V; VPP2=12V; VPP3=–10 V; and VPP4= 7V. The voltages of VCG=–10V and VS=5V are applied to the flash EEPROM during ERASE to extract charges from the floating gate. However, the charges can also be extracted by using a source breakdown voltage under the voltages of VCG=0V and VS=12.5V.

FIG. 5 is a circuit diagram showing a main part of the semiconductor memory device using the EEPROMs in FIG. 1A to 3C according to the first embodiment of the present invention. An EEPROM cell matrix 31 and a flash EEPROM cell matrix 32 are formed in the same cell matrix region such that drain (bit) lines C1 to C3 are aligned. The drain (bit) lines C1 to C3 correspond to drain lines C1' to C3', respectively. Reference symbols R1 to R6 denote row lines. The portions between the drain lines C1 to C3 and the drain lines C1' to C3', i.e., between the matrix 31 and the matrix 32, are open (disconnected) due to the different drain breakdown voltages of the matrices 31 and 32. This open state may be obtained by a switching element. Reference symbols VD1 to VD3 denote drain voltages supplied from the column decoder 3a; reference symbols VD1' to VD3' denote drain voltages supplied from the column decoder 3b; and reference symbols VS1 to VS4 denote source voltages. In the matrices 31 and 32, the intervals between the drain lines C1 to C3 and the intervals between the drain lines C1' to C3' are commonly set, and the cells serving as memory units also have many common portions. Therefore, the matrices 31 and 32 can be formed in the same layout.

With reference to FIGS. 4 and 5, a case wherein a memory cell 33 at the connection point between the line C2 and the line R2 of the EEPROM cell matrix 31 is programmed will be described below. First, an erase operation is to be performed. The selection gate voltage VSG 2 of the line R2 is set to be VSG2=18V to turn on the selection transistor 24. The control gate voltage VCG2 is increased to 18V, electrons are injected from the grounded drain line C2 (drain voltage of VD2=0V) into the floating gate 14. A source voltage VS is kept to be grounded. At this time, the threshold voltage of the transistor 23 is set to be 6V. At this time, all the cells at the connection points between the row line R2 and the column lines C1 to C3 are set in an erase state. Then, in order to perform a write operation, the drain voltage VD2 of the drain line C2 is increased to 18V, the selection gate voltage of VSG2=18V is kept, and the selection transistor 24 is turned on. In addition, the control gate voltage VCG2 is set to be 0V to ground the control gate 16. Therefore, electrons are extracted from the floating gate 14 to the drain line C2. The threshold voltage of the transistor 23 becomes –4V. In this manner, the transistor 23 is programmed. In this case, since the drain lines C1 to C3 are disconnected from the drain lines C1' to C3' between the matrices 31 and 32, the flash EEPROM matrix 32 does not receive any influence from the EEPROM cell matrix 31. Then, in a read operation of the EEPROM cell 33, a drain voltage of VD=1V is applied to a drain line C2, a selection gate voltage of VSG2=5V is applied to the row line R2 of the selection gate 24, and a control gate voltage of VCG2=0V is applied to the control gate 16. In this manner, a cell current flows in the transistor 23, and it can be recognized that the cell 33 is programmed.

With reference to FIGS. 4 and 5, a case wherein a memory cell 34 in the flash EEPROM cell matrix 32 is programmed will be described below. The batch erasure of the matrix 32 is performed. Voltages of 5V are applied as the source voltages VS3 and VS4 of the source lines. Control gate voltages VCG4 to VCG6 of −10V are applied from the row lines R4 to R6 to the control gate of cells. At this time, the drain lines C1' to C3' are set in an open state. As a result, batch erasure is performed and all the transistors located at the connection points between the line C1' to C3' and line R4 to R6 have threshold voltages of +2V. In order to perform a write operation, the drain voltage VD2 of the column line C2 is set to be 7V, the source voltages VS3 and VS4 are grounded, and the control gate voltage VCG5 of the row line R5 is set to be 12V. Therefore, hot carriers are generated by the channel of the transistor 25, and electrons are injected from the channel region of the transistor 25 into the floating gate 14. In this write operation, the threshold voltage of the transistor 25 becomes 7V. A read operation for the cell 34 of the matrix 32 is performed as follows. That is, a voltage of VD2=1V is applied to the drain line C2, the control gate voltage of VCG5=5V is applied to the control gate of the row line R5, and the voltage VS3 of the source line is set to be grounded. Since the transistor 25 is set in an OFF state by the above electron injection, no cell current flows in the transistor 25. In this manner, even when the matrix 32 is updated, since the drain lines between the matrix 31 and the matrix 32 are disconnected from each other, the EEPROM cell matrix 31 does not receive any influence from the flash EEPROM matrix 32.

FIG. 6 is a plan view showing a schematic pattern layout of a semiconductor memory device according to the second embodiment of the present invention. Since the second embodiment essentially corresponds to the first embodiment, the same reference numerals as in the first embodiment denote the same parts in the second embodiment. As the characteristic feature of the second embodiment, a column decoder 3 is commonly used for the matrices 1 and 2, and the column decoder 3b in FIG. 1 is omitted. In the second embodiment, a case wherein an EEPROM and a flash EEPROM are integrally formed will be described. As in the first embodiment, a pair of a mask ROM and an EEPROM, a pair of a RAM and an EEPROM, or the like can be integrally formed in the same cell matrix formation by the technical concept of the present invention. In addition, the present invention can be applied to a structure obtained by arranging different types of memories such as an EEPROM, a flash EEPROM, and a ROM in adjacent cell matrices.

FIG. 7 is a circuit diagram showing a main part of the semiconductor device in FIG. 6. The characteristic features of the circuit in FIG. 7 are described as follows. Depletion MOS transistors 41 to 43 are inserted in drain lines C1 to C3 between the EEPROM matrix 1 and the flash EEPROM matrix 2. The drains C1 to C3 are perfectly commonly used for the matrices 1 and 2. Both the cell matrices are perfectly integrally formed in the cell matrix region in the same memory region. These MOS transistors 41 and 43 are operated as switching elements controlled by a gate voltage RX. The circuit network of FIG. 7 can be constituted by using the perfectly same layout.

A programming operation of an EEPROM cell matrix 31 in FIG. 7 is the same as that in FIG. 5. However, the gate voltage RX of the MOS transistors 41 and 43 is set to be RX=0V to increase the back gate effect of the depletion transistors 41 to 43. As a result, drain line voltages VD1 to VD3 of the decoder 3 are prevented from being substantially transferred to a flash EEPROM cell matrix 32. The batch erasure of the flash EEPROM cell matrix 32 is also the same as that in FIG. 5.

A write operation of the flash EEPROM cell matrix 32 in FIG. 7 is performed as follows. Both the drain voltage VD2 and the gate voltage RX are set to be 12.5V, the source voltages VS3 and VS4 are grounded, and a row line R5 has a voltage of VCG5=12.5V. In this case, channel hot carriers are generated by a transistor 25, and electrons are injected in a floating gate 14. Note that, since the ON resistances of the transistors 41 to 43 are small when the gate voltage RX is set to be 7V, the voltages VD1 to VD3 of the drain lines can properly transfer, and the write operation can be smoothly performed. Then, a read operation of the matrix 32 is performed in the following manner. That is, the gate voltage RX is set to be 7V, the control gate voltage VCG5 of the line R5 is set to be 5V, the drain voltage VD2 is set to be 1V, and the source voltage VS3 is set to be 0V. In this state, since the transistor 25 is turned off by injecting electrons in the floating gate, no cell current flows in the matrix 32.

Figure 8:
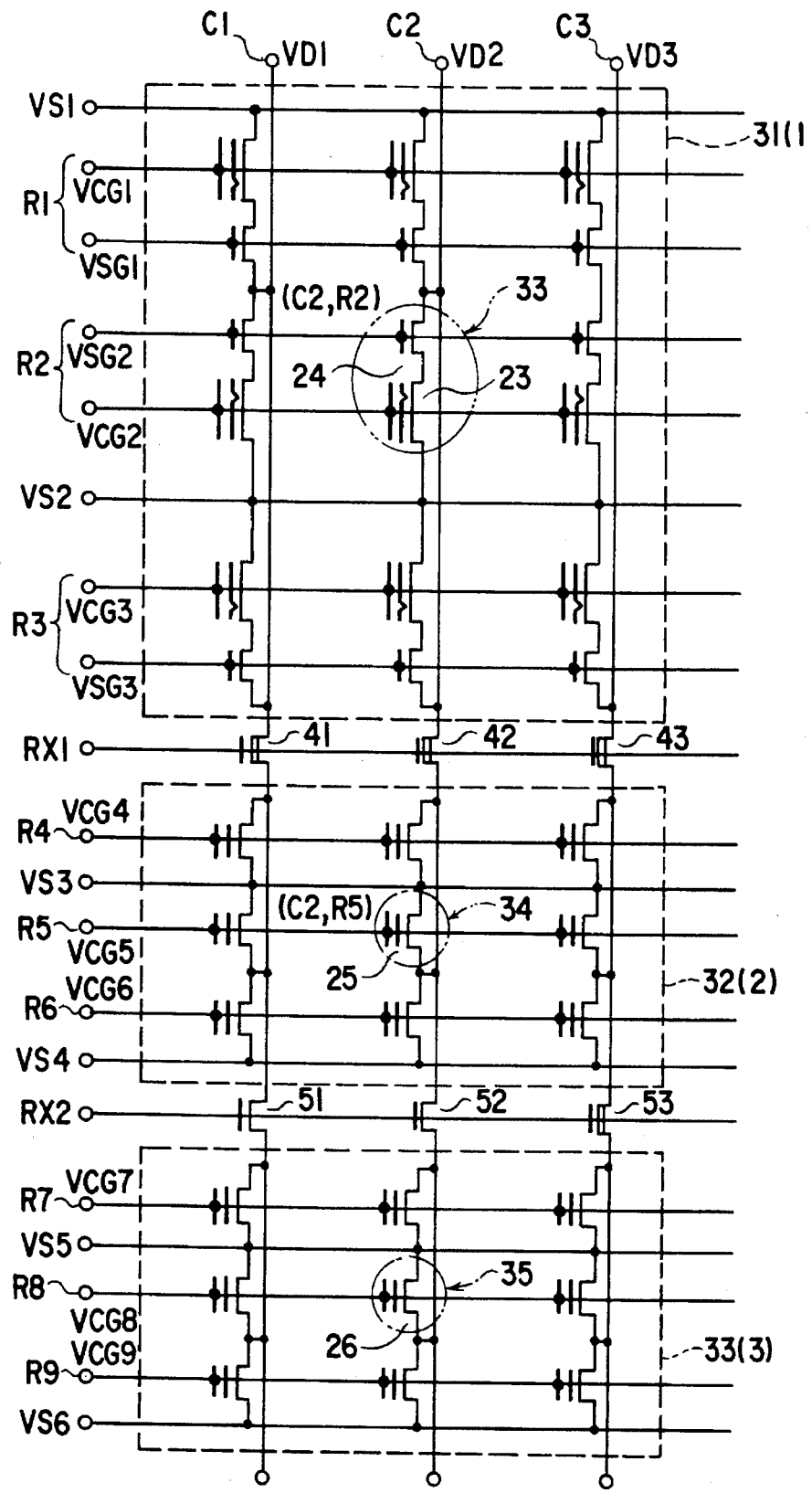
FIG. 8 is a circuit diagram showing another main part of the semiconductor memory device of the second embodiment in FIG. 6.

FIG. 8 is a circuit diagram showing another main part of the semiconductor memory device in FIG. 6. This circuit is constituted by integrally forming an EEPROM cell matrix 31, a flash EEPROM cell matrix 32, and an EPROM (or One Time PROM) 33 in the same cell matrix region. In the circuit in FIG. 8, drain lines C1 to C3 for the EEPROM cell matrix 31 are connected to drain lines C1 to C3 for the flash EEPROM cell matrix 32 by depletion MOS transistors 41 to 43, respectively. The drain lines C1 to C3 for the flash EEPROM cell matrix 32 are connected to drain lines C1 to C3 for the One Time PROM (OTP) 33 by depletion MOS transistors 51 to 53, respectively. Although the depletion MOS transistors 41 to 43 and 51 to 53 are operated as switching elements, the depletion MOS transistors 41 to 43 can have ON resistances different from those of the depletion MOS transistors 51 to 53. When gate voltages RX1 and RX2 are set to have different values, the ON resistances can also be changed. As a result, different drain voltages can be applied to the cell matrices 31, 32 and 33 by using the common drain lines C1 to C3. Since the operations of the cell matrices 31, 32 and 33 in FIG. 8 can be described as in FIG. 7, a description thereof will be omitted. It is apparent that the circuit network of FIG. 8 can be constituted by using the perfectly same layout.

The present invention is not limited to the above embodiments, and various modifications of the present invention can be made. For example, in each of the embodiments, although a depletion MOS transistor is used as the transistor 25 whose gate receives the voltage RX, an enhancement MOS transistor is used as the transistor 25. The transistor 25 may have a switching operation.

As has been described above, according to the present invention, different types of memory matrices can be adjacently arranged in the same cell matrix region in the same memory region, and the number of decoders can be decreased such that bit lines can be commonly driven by a decoder. In addition, since a memory chip size or a memory core size can be decreased, spaces for the chip memories and a circuit area for the chip memories can be used without any waste, and a high integration density can be obtained.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A semiconductor memory device comprising:
    different types of first and second memory matrices adjacently formed in the same layout in the cell matrix region on the same semiconductor substrate such that column lines of said memory matrices are aligned with each other, said column lines being disconnected from each other between said first and second memory matrices;

switching elements inserted between said column lines of said first and second memory matrices, said column lines being disconnected from each other by turning off said switching elements;

a first column decoder for alternatively selecting column lines of said first memory matrix and a first row decoder alternatively selecting row lines of said first memory matrix; and a second column decoder for alternatively selecting column lines of said second memory matrix and a second row decoder for alternatively selecting row lines of said second memory matrix.

2. A semiconductor memory device comprising:

different types of memory matrices in the same cell matrix region on the same semiconductor substrate and adjacently arranged in the same layout, said memory matrices having common column lines extending therebetween, said column lines of said different types of memory matrices being connected to each other by switching elements;

a common column decoder for alternatively selecting said common column lines of said different types of memory matrices; and a plurality of row decoders, each for alternatively selecting row lines of a corresponding one of said different types of memory matrices.

3. A semiconductor memory device comprising:

different types of memory matrices in the same cell matrix region on the same semiconductor substrate and adjacently arranged in the same layout, said memory matrices having common column lines extending therebetween;

switching elements inserted between column lines of said different types of memory matrices to form said common column lines, said switching elements having a first ON resistance when one of said memory matrices is operated and a second ON resistance when another of said memory matrices is operated;

a common column decoder for alternatively selecting said common columns of said different types of memory matrices; and a plurality of row decoders, each for alternatively selecting row lines of a corresponding one of said different types of memory matrices.

4. A device according to claim 3 wherein said switching elements comprise MOS transistors.

5. A memory device comprising:

a first memory cell array containing memory cells of a first type and arranged in a first row and column matrix;

a second memory cell array containing memory cells of a second type different than the first type and arranged in a second row and column matrix, said second memory cell array being aligned in a column direction with said first memory cell array and being formed in the same layout as said first memory cell array;

column lines, each column line extending in said column direction and containing a first column line portion connecting a column of memory cells of said first memory cell array and a second column line portion connecting the column of memory cells of said second memory cell array that is aligned with said column of memory cells of said first memory cell array; and decoding circuitry for decoding address data to select a memory cell in one of said first and second memory cell arrays, said decoding circuitry comprising a first column decoder coupled to the first column line portion of each of said column lines and a second column decoder coupled to the second column line portion of each of said column lines.

6. A memory device according to claim 5, wherein said first column line portion and said second column line portion of each said column line are electrically disconnected.

7. A memory device according to claim 6, wherein:

said first column decoder is arranged adjacent to said first memory cell array and said second column decoder is arranged adjacent to said second memory cell array so that said first column decoder and said second column decoder are separated in said column direction by said first and second memory cell arrays.

8. A memory device comprising:

a first memory cell array containing memory cells of a first type and arranged in a first row and column matrix;

a second memory cell array containing memory cells of a second type different than the first type and arranged in a second row and column matrix, said second memory cell array being aligned in a column direction with said first memory cell array and being formed in the same layout as said first memory cell array;

column lines, each column line extending in said column direction and containing a first column line portion connecting a column of memory cells of said first memory cell array and a second column line portion connecting the column of memory cells of said second memory cell array that is aligned with said column of memory cells of said first memory cell array;

switching elements, each coupled between the first column line portion and the second column line portion of one of said column lines, wherein said switching elements selectively connect and disconnect said first and second column line portions; and decoding circuitry for decoding address data to select a memory cell in one of said first and second memory cell arrays.

9. A memory device according to claim 8, wherein said switching elements comprise MOS transistors.

10. A memory device according to claim 9, wherein said decoding circuitry comprises a column decoder adjacent to said first memory cell array and coupled to said first column line portions, and said MOS transistors are OFF when said column decoder selects a column of memory cells of said first memory cell array and at least one of said MOS transistors is ON when said column decoder selects a column of memory cells in said second memory cell array.

* * * * *

UNITED STATES PATENT AND TRADEMARK OFFICE
CERTIFICATE OF CORRECTION

PATENT NO. : 5,553,016
DATED : September 3, 1996
INVENTOR(S) : Masataka Takebuchi It is certified that error appears in the above-indentified patent and that said Letters Patent is hereby corrected as shown below:

Column 8, after line 60, insert-- 11. A memory device according to claim 2, wherein switching elements comprise MOS transistors.--.

Signed and Sealed this

Third Day of June, 1997

Attest:

BRUCE LEHMAN

*Attesting Officer*   *Commissioner of Patents and Trademarks*